US010957737B2

(12) United States Patent
Adiga et al.

(10) Patent No.: US 10,957,737 B2
(45) Date of Patent: *Mar. 23, 2021

(54) SYMMETRICAL QUBITS WITH REDUCED FAR-FIELD RADIATION

(71) Applicant: International Business Machines Corporation, Armonk, NY (US)

(72) Inventors: Vivekananda P. Adiga, Ossining, NY (US); Martin O. Sandberg, Ossining, NY (US); Jerry M. Chow, White Plains, NY (US); Hanhee Paik, Danbury, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/735,851

(22) Filed: Jan. 7, 2020

(65) Prior Publication Data
US 2020/0203424 A1    Jun. 25, 2020

Related U.S. Application Data

(63) Continuation of application No. 16/054,326, filed on Aug. 3, 2018, now Pat. No. 10,573,685.

(51) Int. Cl.
*H01L 27/18* (2006.01)
*G06N 10/00* (2019.01)
(Continued)

(52) U.S. Cl.
CPC ............. *H01L 27/18* (2013.01); *G06N 10/00* (2019.01); *H01L 39/025* (2013.01); *H01L 39/2493* (2013.01); *H01L 39/249* (2013.01)

(58) Field of Classification Search
CPC ... H01L 27/18; H01L 39/025; H01L 39/2493; H01L 39/249; G06N 10/00
(Continued)

(56) References Cited

U.S. PATENT DOCUMENTS 7,219,018 B2   5/2007   Vitaliano et al.
7,605,600 B2  10/2009   Harris
(Continued)

FOREIGN PATENT DOCUMENTS

EP     2 264 653 A1   12/2010
EP     3088354        11/2016
EP     3217336         9/2017

OTHER PUBLICATIONS

Non-Final Office Action received for U.S. Appl. No. 16/054,326 dated May 29, 2019, 19 pages.
(Continued)

*Primary Examiner* — Tu-Tu V Ho
(74) *Attorney, Agent, or Firm* — Amin, Turocy & Watson, LLP

(57) ABSTRACT

Symmetrical qubits with reduced far-field radiation are provided. In one example, a qubit device includes a first group of superconducting capacitor pads positioned about a defined location of the qubit device, wherein the first group of superconducting capacitor pads comprise two or more superconducting capacitor pads having a first polarity, and a second group of superconducting capacitor pads positioned about the defined location of the qubit device in an alternating arrangement with the first group of superconducting capacitor pads, wherein the second group of superconducting capacitor pads comprise two or more superconducting capacitor pads having a second polarity that is opposite the first polarity.

20 Claims, 17 Drawing Sheets

(51) Int. Cl.
*H01L 39/02* (2006.01)
*H01L 39/24* (2006.01)

(58) Field of Classification Search
USPC .......................................................... 257/31
See application file for complete search history.

(56) References Cited

U.S. PATENT DOCUMENTS

| | | | |
|---|---|---|---|
| 8,972,921 | B2 | 3/2015 | Abraham et al. |
| 10,573,685 | B1 * | 2/2020 | Adiga ................. H01L 39/2493 |
| 2016/0292587 | A1 | 10/2016 | Rigetti et al. |
| 2017/0206461 | A1 | 7/2017 | Friesen et al. |
| 2018/0138987 | A1 | 5/2018 | Sliwa et al. |
| 2019/0044046 | A1 | 2/2019 | Caudillo et al. |
| 2019/0131511 | A1 | 5/2019 | Clarke et al. |
| 2019/0137891 | A1 | 5/2019 | Brink et al. |

OTHER PUBLICATIONS

Roy, et al., Implementation of pairwise longitudinal coupling in a three qubit superconducting circuit, Oct. 26, 2016, 16 Pages.
Lecocq, et al., Junction fabrication by shadow evaporation without a suspended bridge, Nanotechnology, vol. 22, Jul. 8, 2011, 6 Pages.
Braumuller, et al., Concentric transmon qubit featuring fast tunability and an anisotropic magnetic dipole moment, Applied Physics Letters, Jan. 21, 2016, 6 Pages.
Koch, et al., Charge-insensitive qubit design derived from the Cooper pair box, Physical Review, Oct. 12, 2007, 19 Pages.
Gambetia, et al., Superconducting Qubit with Purcell Protection and Tunable Coupling, Physical Review, Jan. 20, 2011, 4 Pages.
International Search Report and Written Opinion for PCT/EP2019/070497 dated Nov. 21, 2019, 12 pages.

* cited by examiner

SYMMETRICAL QUBITS WITH REDUCED FAR-FIELD RADIATION

BACKGROUND

The subject disclosure relates to quantum computing, and more specifically, to techniques facilitating qubit design and fabrication for quantum computers.

As computer technology advances and conventional computing devices decrease in physical scale, a growing interest has been placed on quantum computing as a technique by which computing technology can continue to advance past the physical limitations of traditional computers. A quantum computer can operate via superconducting quantum logic circuits, which can include arrays of qubits linked by quantum buses. One type of qubit that can be utilized is the transmon qubit, which is discussed by Koch et al., "Charge-insensitive qubit design derived from the Cooper pair box," Phys. Rev. A 76, 042319 (2007). As discussed by Koch et al., "[a] transmon consists of two superconducting islands coupled through two Josephson junctions, but isolated from the rest of the circuitry." Koch et al. further discusses that a transmon includes "a shunting connection of the two superconductors via a large capacitance $C_B$ accompanied by a similar increase in the gate capacitance $C_g$."

The capacitances associated with transmon qubits can result in radiation losses and crosstalk between separate qubits and far-field radiation emitted from individual qubits, which can both have an adverse impact on qubit circuit size and efficiency. A technique for reducing crosstalk between different qubits is discussed by Abraham et al., "SYMMETRIC PLACEMENT OF COMPONENTS ON A CHIP TO REDUCE CROSSTALK INDUCED BY CHIP MODES," U.S. Pat. No. 8,972,921. Abraham et al. discusses reduction of inter-qubit crosstalk via > a chip comprising two circuits arranged as mirror images of each other on a substrate. Each of the circuits . . . includes three qubits that are interrogated by microwave pulses through their interaction with microwave resonators or harmonic oscillators that store RF energy. The circuits also each include five ports through which drive signals are introduced and output signals of the circuit are received"

(reference numerals omitted). With respect to far-field radiation emitted by an individual qubit, however, there exists a need in the art for techniques to improve the size and efficiency of a multi-qubit circuit via reduction of said radiation.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, computer-implemented methods, apparatus and/or computer program products that facilitate qubit design and fabrication for quantum computers.

According to an embodiment, a qubit device can include a first group of superconducting capacitor pads positioned about a defined location of the qubit device, wherein the first group of superconducting capacitor pads include two or more superconducting capacitor pads having a first polarity. The qubit device also includes a second group of superconducting capacitor pads positioned about the defined location of the qubit device in an alternating arrangement with the first group of superconducting capacitor pads, wherein the second group of superconducting capacitor pads include two or more capacitor pads having a second polarity that is opposite the first polarity. The qubit device according to this embodiment has the advantage of reduced far-field radiation and reduced qubit device size, among other advantages.

In certain embodiments, the qubit device can additionally include a first set of connectors that electrically couples respective ones of the first group of superconducting capacitor pads and a second set of connectors that electrically couples respective ones of the second group of superconducting capacitor pads. The first set of junctions and the second set of junctions can be rotationally symmetric about the defined location, resulting in improved structural integrity of the qubit device. Also or alternatively, the qubit device can further include an oxide barrier formed onto at least a portion of a surface of the first set of connectors, and at least a portion of the second set of connectors can be formed onto a surface of the oxide barrier that is opposite the first set of connectors, thereby defining a Josephson junction between the first set of connectors and the second set of connectors that can have increased mechanical stability, among other advantages. The qubit device can also include respective capacitor gaps formed between respective ones of the first group of superconducting capacitor pads and the second group of superconducting capacitor pads, where a size of the capacitor gaps can be increased with reduced impact of the size of the capacitor gaps on radiation loss. The qubit device can additionally include respective coupling pads positioned adjacent to respective ones of at least one of the first group of superconducting capacitor pads or the second group of superconducting capacitor pads, which can result in reduced qubit-to-qubit coupling and reduced overall qubit circuit size, among other advantages. The respective coupling pads can be associated with, e.g., at least one of a bus resonator or a readout resonator.

According to another embodiment, a qubit device can include a first set of connectors that electrically couples first superconducting capacitor pads positioned about a defined location of the qubit device. The qubit device can also include a second set of connectors that electrically couples second superconducting capacitor pads positioned about the defined location of the qubit device, and a Josephson junction formed between the first set of connectors and the second set of connectors. The qubit device according to this embodiment has the advantage of reduced far-field radiation and reduced qubit device size, among other advantages.

In certain embodiments, the first superconducting capacitor pads can have a first polarity, the second superconducting capacitor pads can have a second polarity that is opposite the first polarity, and the first superconducting capacitor pads and the second superconducting capacitor pads can be positioned in an alternating arrangement about the defined location of the qubit device, resulting in a reduction in a contribution of the capacitor pads to radiation losses. In other embodiments, an oxide barrier can be formed onto a least a portion of a surface of the first set of connectors, and at least a portion of the second set of connectors can be formed onto a surface of the oxide barrier that is opposite the first set of connectors, thereby defining the Josephson junction between the first set of connectors and the second set of connectors as well as improving mechanical stability of the Josephson junction. The first set of connectors and the second set of connectors can be rotationally symmetric about the defined location, resulting in improved structural integrity of the qubit device. The qubit device can further include respective coupling pads positioned adjacent to respective ones of the first superconducting capacitor pads or the second superconducting capacitor pads, which can result in reduced qubit-to-qubit coupling and reduced overall qubit circuit size, among other advantages.

According to a further embodiment, a method can include forming a first set of connectors that electrically couples first superconducting capacitor pads positioned about a defined location of a superconducting metal layer, oxidizing a surface of the first set of connectors, resulting in an oxidized connector layer, and forming a second set of connectors that electrically couples second superconducting capacitor pads positioned about the defined location of the superconducting metal layer. At least a portion of the second set of connectors can be formed onto the oxidized connector layer, resulting in a Josephson junction between the first set of connectors and the second set of connectors at the oxidized connector layer. The method according to this embodiment has the advantage of fabricating qubit devices with reduced far-field radiation and reduced qubit size, among other advantages.

In certain embodiments, the first set of connectors and the second set of connectors can include aluminum and the Josephson junction can include aluminum oxide, resulting in improved simplicity of device fabrication and the materials used for fabrication. The method can further include etching respective capacitor gaps in the superconducting metal layer, where the respective capacitor gaps define the first superconducting capacitor pads and the second capacitor pads, which can similarly result in improved simplicity of device fabrication. The method can additionally include undercutting at least one of the first set of connectors or the second set of connectors, thereby reducing a contribution of a central portion of the capacitor gaps and superconducting capacitor pads to device energy loss. The method can also include etching respective coupling pads in the superconducting metal layer adjacent to respective ones of the first superconducting capacitor pads or the second superconducting capacitor pads, which can result in reduced qubit-to-qubit coupling and reduced overall qubit circuit size, among other advantages.

According to an additional embodiment, a qubit device can include a plurality of superconducting capacitor pads positioned about a defined location of the qubit device, where respective ones of the plurality of superconducting capacitor pads positioned about the defined location of the qubit device have respective polarities that alternate between a first polarity and a second polarity that is opposite the first polarity, and an airbridge structure that electrically couples respective ones of the plurality of superconducting capacitor pads that have a same polarity. The qubit device according to this embodiment has the advantage of reduced far-field radiation and reduced qubit size, among other advantages.

In certain embodiments, the qubit device can include a Josephson junction formed between at least a first superconducting capacitor pad having the first polarity and a second superconducting capacitor pad having the second polarity, which can result in an efficient and mechanically stable Josephson junction, among other advantages. The airbridge structure can be suspended at a nonzero distance from a substrate of the qubit device and electrically couple respective second ones of the plurality of superconducting capacitor pads that have the first polarity, and the qubit device can further include a connecting structure adjacent to the substrate of the qubit device that electrically couples respective first ones of the plurality of superconducting capacitor pads that have the second polarity. By suspending the airbridge structure, the qubit device can have the advantage of reduced contribution of a central portion of the qubit device to energy loss, among other advantages. The qubit device can further include capacitor gaps formed between respective ones of the plurality of superconducting capacitor pads, where a size of the capacitor gaps can be increased with reduced impact of the size of the capacitor gaps on radiation loss. The qubit device can additionally include respective coupling pads positioned adjacent to respective ones of the plurality of superconducting capacitor pads, where the respective coupling pads are associated with at least one of a bus resonator or a readout resonator, which can result in reduced qubit-to-qubit coupling and reduced overall qubit circuit size, among other advantages.

According to yet another embodiment, a method can include etching respective capacitor gaps in a superconducting metal layer deposited onto a dielectric material, the respective capacitor gaps forming a plurality of superconducting capacitor pads positioned about a defined location of the superconducting metal layer, where respective ones of the plurality of superconducting capacitor pads positioned about the defined location of the superconducting metal layer have respective polarities that alternate between a first polarity and a second polarity that is opposite the first polarity. The method can further include forming an airbridge structure that electrically couples respective ones of the plurality of superconducting capacitor pads that have a same polarity. The method according to this embodiment has the advantage of fabricating qubit devices with reduced far-field radiation, among other advantages.

In certain embodiments, the method can also include forming a Josephson junction between at least a first superconducting capacitor pad having the first polarity and a second superconducting capacitor pad having the second polarity, resulting in a Josephson junction between the first set of connectors and the second set of connectors at the oxidized connector layer, which can result in an efficient and mechanically stable Josephson junction, among other advantages. Forming the airbridge structure can include forming a connecting structure onto the dielectric material that electrically couples respective ones of the plurality of superconducting capacitor pads that have the first polarity, forming the airbridge structure onto the dielectric material, the airbridge structure electrically coupling respective ones of the plurality of superconducting capacitor pads that have the second polarity, and undercutting the airbridge structure, thereby releasing the airbridge structure from the dielectric material and reducing contribution of a central portion of the qubit device to energy loss, among other advantages.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. Further, it should be appreciated that respective elements depicted by the drawings are not shown to scale with respect to other elements of the same drawing and/or different drawings, and that, where appropriate, certain elements depicted by the drawings have been enlarged, reduced, and/or repositioned to facilitate clearer illustration of the embodiments described herein.

Figure 1:
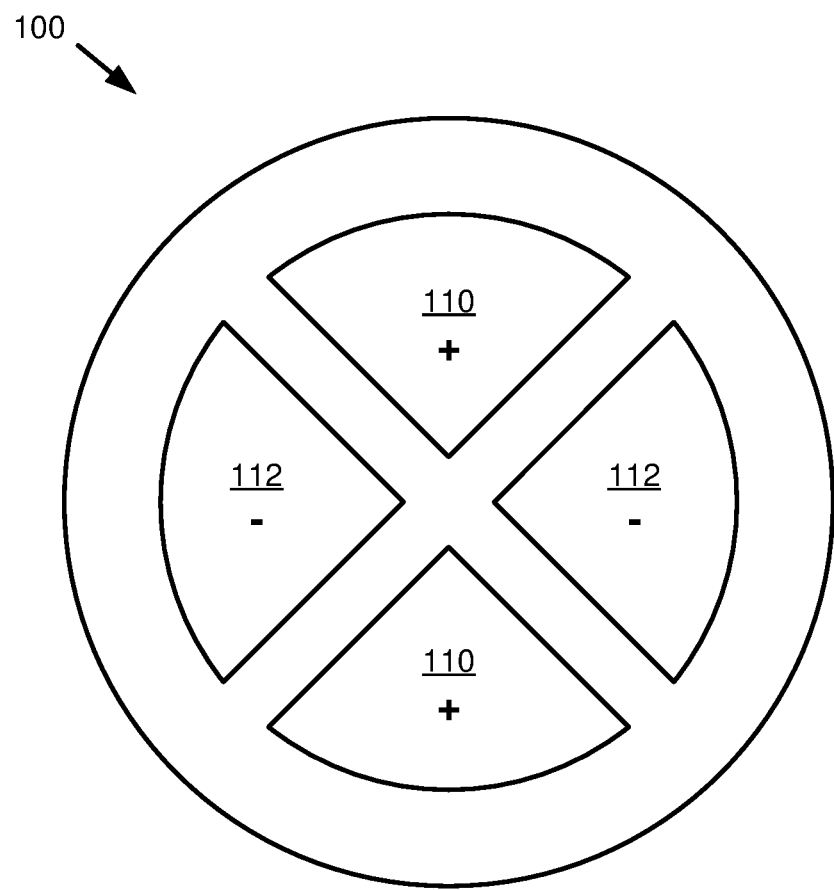
FIG. 1 is a schematic diagram of a symmetrical qubit device with reduced far-field radiation according to one or more embodiments described herein.

With reference now to the drawings, FIG. 1 illustrates a schematic diagram of a qubit device 100 that facilitates reduced far-field radiation according to one or more embodiments described herein. Repetitive description of like elements employed in other embodiments described herein is omitted for sake of brevity. As shown in FIG. 1, the qubit device 100 includes a first group of superconducting capacitor pads 110 and a second group of superconducting capacitor pads 112. For brevity, the superconducting capacitor pads 110, 112 are also referred to herein as simply "pads" or "capacitor pads." In an aspect, the first group of pads 110 and the second group of pads 112 can be respectively positioned about a defined location of the qubit device 100. In the example shown by FIG. 1, the pads 110, 112 are arranged in a substantially circular formation, and the defined location about which the pads 110, 112 are positioned is a center point of the formation. Other formations and/or location definitions could also be used.

In an aspect, the pads 110, 112 have polarities such that respective ones of the first group of pads 110 have a first polarity (e.g., a positive polarity) and respective ones of the second group of pads 112 have a second polarity (e.g., a negative polarity) that is opposite the first polarity. In one example, the pads 110, 112 can oscillate at a given frequency (e.g., 5 GHz) and the polarity of the respective pads 110, 112 can be defined based on differences in phase. For instance, the negative polarity pads 112 shown in FIG. 1 can operate at a phase difference of one half-cycle, one quarter-cycle, and/or any other suitable offset relative to the positive polarity pads 110.

In another aspect, the qubit device 100 shown by FIG. 1 can be arranged as a quadrapole qubit, in which each of the four respective pads 110, 112 of the qubit device 100 are associated with respective qubit poles. These qubit poles can be utilized in association with coupling the qubit device 100 to buses, readouts, other qubits, etc., as will be described in further detail below.

In another aspect, the pads 110, 112 can be arranged within the qubit device 100 in a symmetric or near-symmetric manner. For instance, the pads 110, 112 of the qubit device 100 shown in FIG. 1 are arranged such that they are rotationally symmetric about the center point of the qubit device 100. Other arrangements and/or symmetries could also be used. By leveraging symmetry between device components as shown by FIG. 1, various advantages can be realized. For instance, far field radiation associated with the qubit device 100 to the external environment can be reduced significantly, e.g., on the order of hundreds of times less radiation than that associated with conventional qubits. Additionally, the qubit design techniques provided herein can result in reduced overall qubit size, more simplified fabrication, and/or improved qubit device stability. Further, the qubit design techniques provided herein can facilitate coupling of respective buses to anti-pads as opposed to the same pad, thereby also reducing bus coupling. As another result of the reduction in far field radiation associated with the qubit design techniques described herein, respective qubits in a multi-qubit circuit can be placed closer together, thereby reducing overall qubit circuit size. Reducing far field radiation as described herein can additionally increase the coherence of an associated qubit device, which can in turn improve qubit design flexibility with respect to parameters such as pad size, gap size, or the like. Other advantages of the embodiments provided herein can also be realized.

While the qubit device 100 shown in FIG. 1 is arranged in a circular configuration, it should be appreciated that the qubit device 100 and its respective pads 110, 112 can be of any shape suitable for improving the capacitance and/or coherence of the qubit, and that other shapes and/or configurations could be employed. For instance, respective fingers could be included in the respective pads 110, 112, or the shape of pads 110, 112 could be otherwise optimized for adjusting the coherence and/or capacitance of the qubit device 100. Other adjustments to the qubit device 100 shown in FIG. 1 are also possible.

Figure 2:
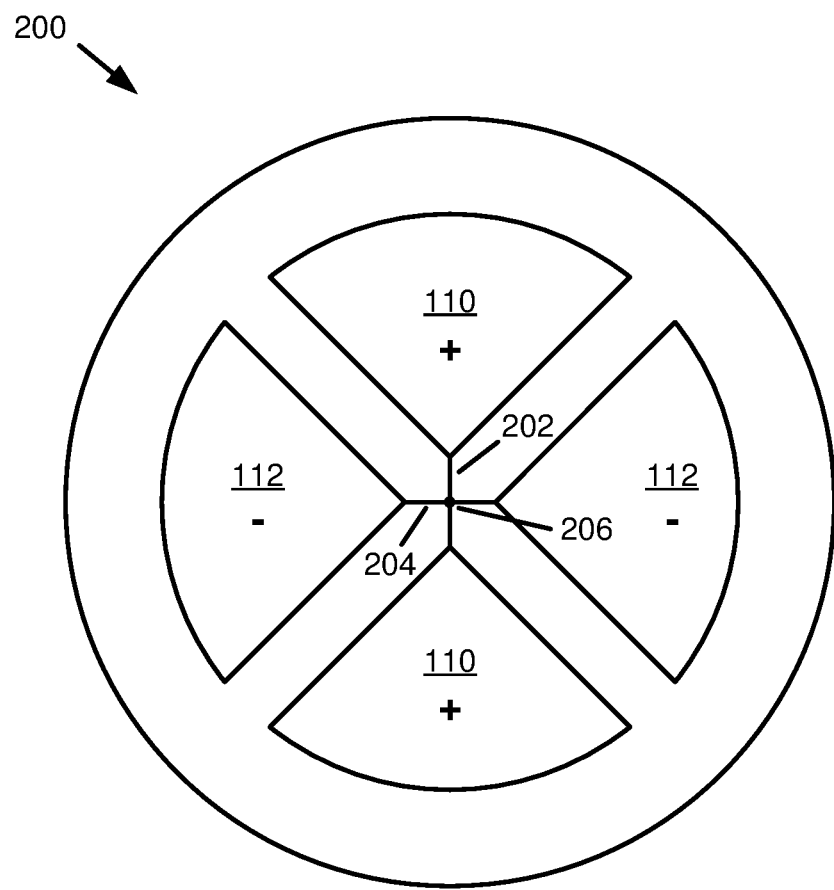
FIG. 2 is a schematic diagram of a qubit device having respective sets of junctions according to various embodiments described herein.

Referring next to FIG. 2, a schematic diagram of a qubit device 200 having respective sets of connectors 202, 204 according to various embodiments described herein is illustrated. Repetitive description of like elements employed in other embodiments described herein is omitted for sake of brevity. As shown in FIG. 2, the qubit device 200 can include a plurality of superconducting capacitor pads 110, 112, which alternate in polarity between a first polarity and a second polarity similar to those described above with respect to FIG. 1. As further shown in FIG. 2, the qubit device 200 can include respective sets of connectors 202, 204 that electrically couple at least two of the pads 110, 112 having a same polarity. In the non-limiting example shown by FIG. 2, a first set of connectors 202 can electrically couple respective ones of the capacitor pads 110 having the first (positive) polarity, and a second set of connectors 202 can electrically couple respective ones of the capacitor pads 112 having the second (negative) polarity.

In an aspect, the first set of connectors 202 and the second set of connectors 204 are separated in three-dimensional space, e.g., into or out of the page with reference to FIG. 2, by an oxide barrier formed between the two sets of connectors 202, 204, which in turn defines a junction 206 (e.g., a Josephson junction) between the connectors 202, 204. For instance, an oxide barrier can be formed onto at least a portion of a surface of a first set of connectors 202, 204, e.g., by oxidizing a surface of the connectors 202, 204 to create an oxidized connector surface comprising a metal-oxide layer. The second set of connectors 202, 204 can then be formed onto a surface of the oxide barrier that is opposite the first set of connectors to define the junction 206. Techniques for fabricating a junction 206 via connectors 202, 204 are described in further detail below.

In an aspect, the connectors 202, 204 can be rotationally symmetric about the same defined location of the qubit device 200 relative to which the pads 110, 112 are positioned. In the example shown by FIG. 2, the connectors 202, 204 of qubit device 200 are positioned about the center of the qubit device 200. It should be appreciated, however, that other configurations could be used without departing from the scope of the embodiments described herein. In one example, the structure integrity of the qubit device 200 can be improved by utilizing multiple sets of connectors 202, 204 as shown by FIG. 2 by, e.g., increasing the number of locations at which the connectors 202, 204 are physically supported within the qubit device 200. This, in turn, can facilitate increased (deeper) trenching during fabrication of the qubit device 200, improved qubit device surface area, and/or other advantages.

In another aspect, the pads 110, 112 can oscillate in frequency in a similar manner to that described above with respect to FIG. 1, thereby producing respective capacitances between the pads 110, 112 of the qubit device 200. These capacitances can result in the storage of electrical energy via the pads 110, 112 as well as the storage of magnetic energy via a junction formed between the connectors 202, 204, and these stored energies can be utilized by the qubit device 200 to facilitate performance of one or more quantum computing operations.

Figure 3:
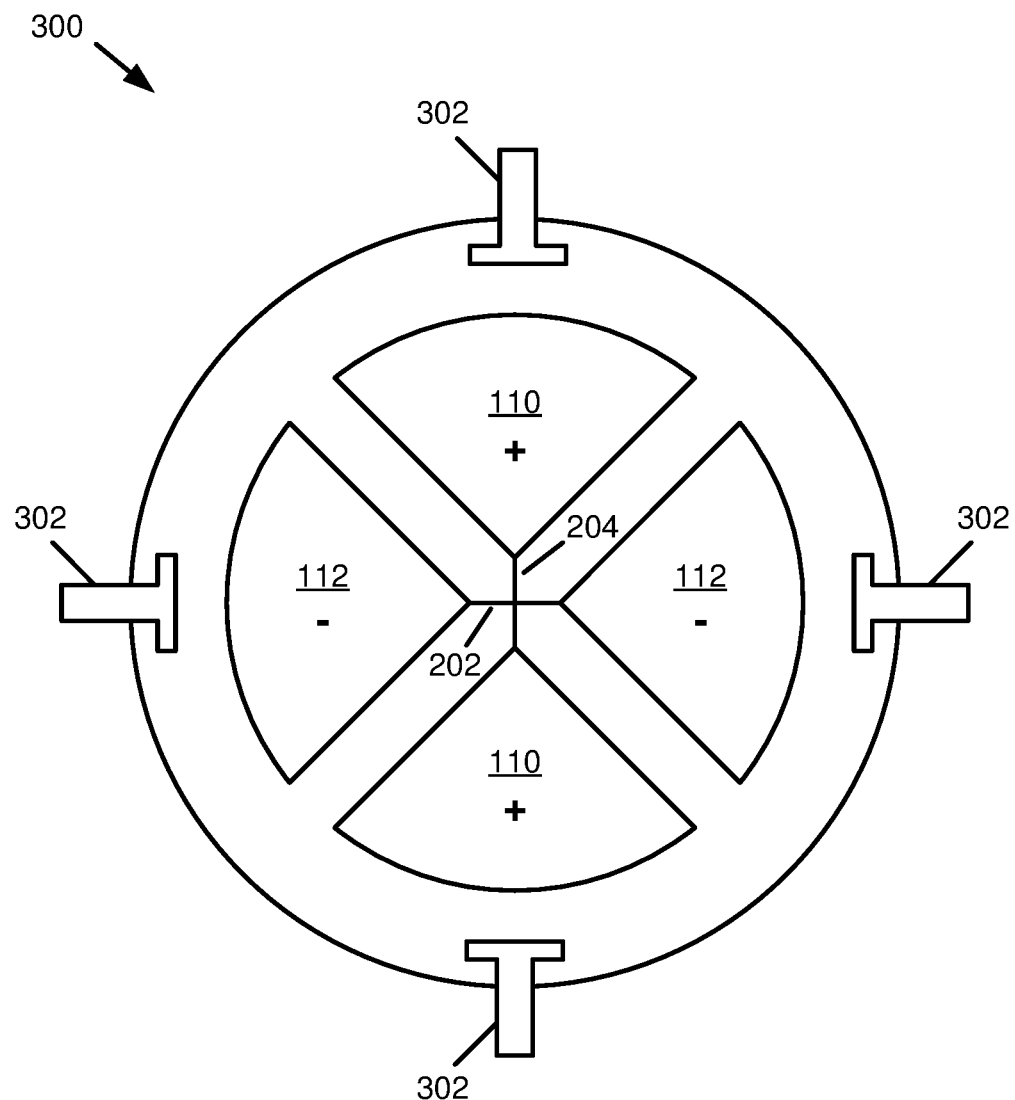
FIG. 3 is a schematic diagram of a qubit device having respective coupling pads according to various embodiments described herein.

With reference next to FIG. 3, a qubit device 300 having respective coupling pads according to various embodiments described herein is illustrated. Repetitive description of like elements employed in other embodiments described herein is omitted for sake of brevity. In addition to the capacitor pads 110, 112 and connectors 202, 204 shown by FIGS. 1-2, the qubit device 300 shown by FIG. 3 can include respective coupling pads 302 positioned adjacent to respective ones of the capacitor pads 110, 112. In an aspect, the coupling pads 302 shown in FIG. 3 can be associated with a bus resonator and/or a readout resonator and facilitate connections between respective ones of the pads 110, 112 and respective quantum buses, readouts, and/or other suitable components.

In an aspect, the coupling pads 302 associated with qubit device 300 can enable respective buses, readouts, and/or other inputs and/or outputs to be connected to different pads. As a result, crosstalk associated with connecting multiple buses to the same pad can be reduced. Additionally, by enabling buses to be coupled to an anti-pad as opposed to the same pad, overall qubit-to-qubit coupling and/or bus coupling can be reduced. Other advantages could also be realized.

Referring now to FIGS. 4-7, respective steps of a process for fabricating a symmetrical qubit with reduced far-field radiation according to various embodiments described herein are illustrated. Repetitive description of like elements employed in other embodiments described herein is omitted for sake of brevity. It should be appreciated that FIGS. 4-7 and their accompanying description are provided merely as a non-limiting example of a qubit fabrication process that could be used and that other suitable processes are also possible.

Figure 4:
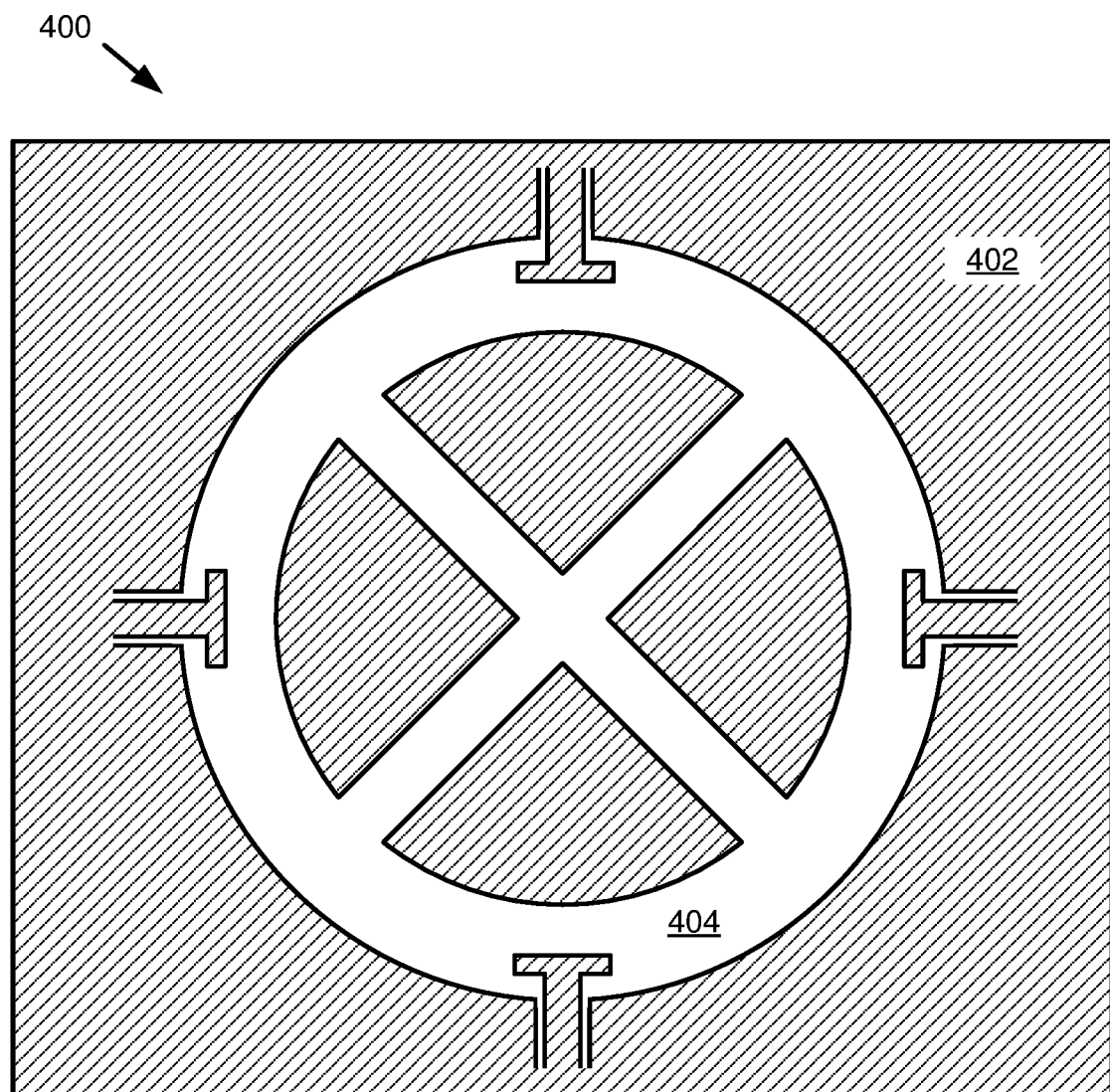
FIGS. 4-8 are diagrams illustrating respective process steps for fabricating a symmetrical qubit with reduced far-field radiation according to various embodiments described herein.
Figure 5:
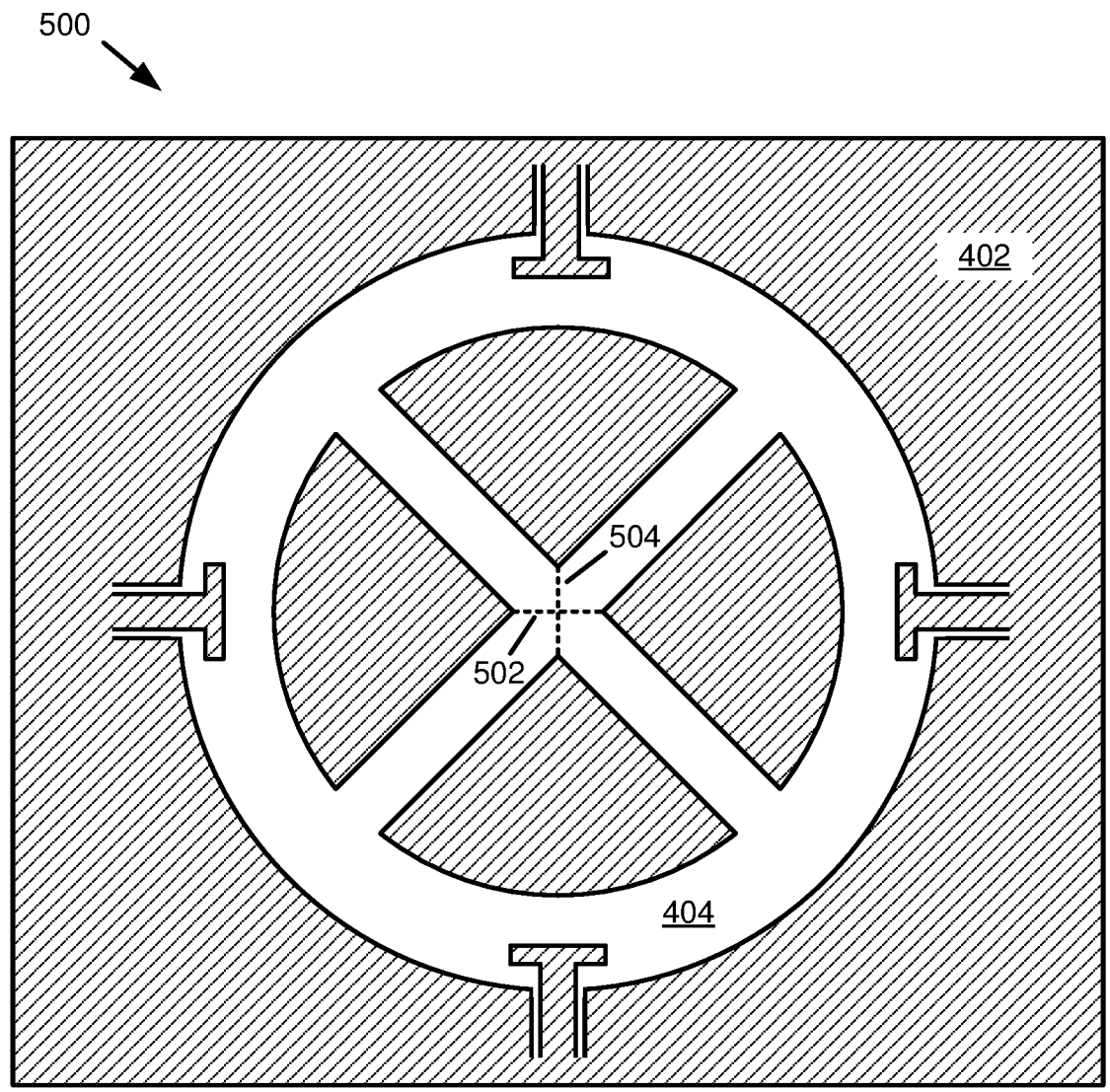

In an aspect, an example qubit fabrication process can begin as shown by diagram 400 in FIG. 4, in which the structure of the qubit device can be defined within a device area. The device area can include, e.g., a dielectric material covered by a superconducting metal layer 402. As shown by diagram 400, the qubit device structure can include one or more resonators (e.g., bus resonators and/or readout resonators) and associated coupling pads. The structure shown in diagram 400 can further include one or more capacitor pads positioned about a defined location of the superconducting metal layer 402 as defined by respective capacitor gaps 404. In an aspect, a size of the capacitor gaps 404 can be selected to reduce far-field radiation emitted by the qubit device, to reduce the coupling from the qubit device to the external environment, to optimize surface losses, and/or based on other criteria.

Figure 6:
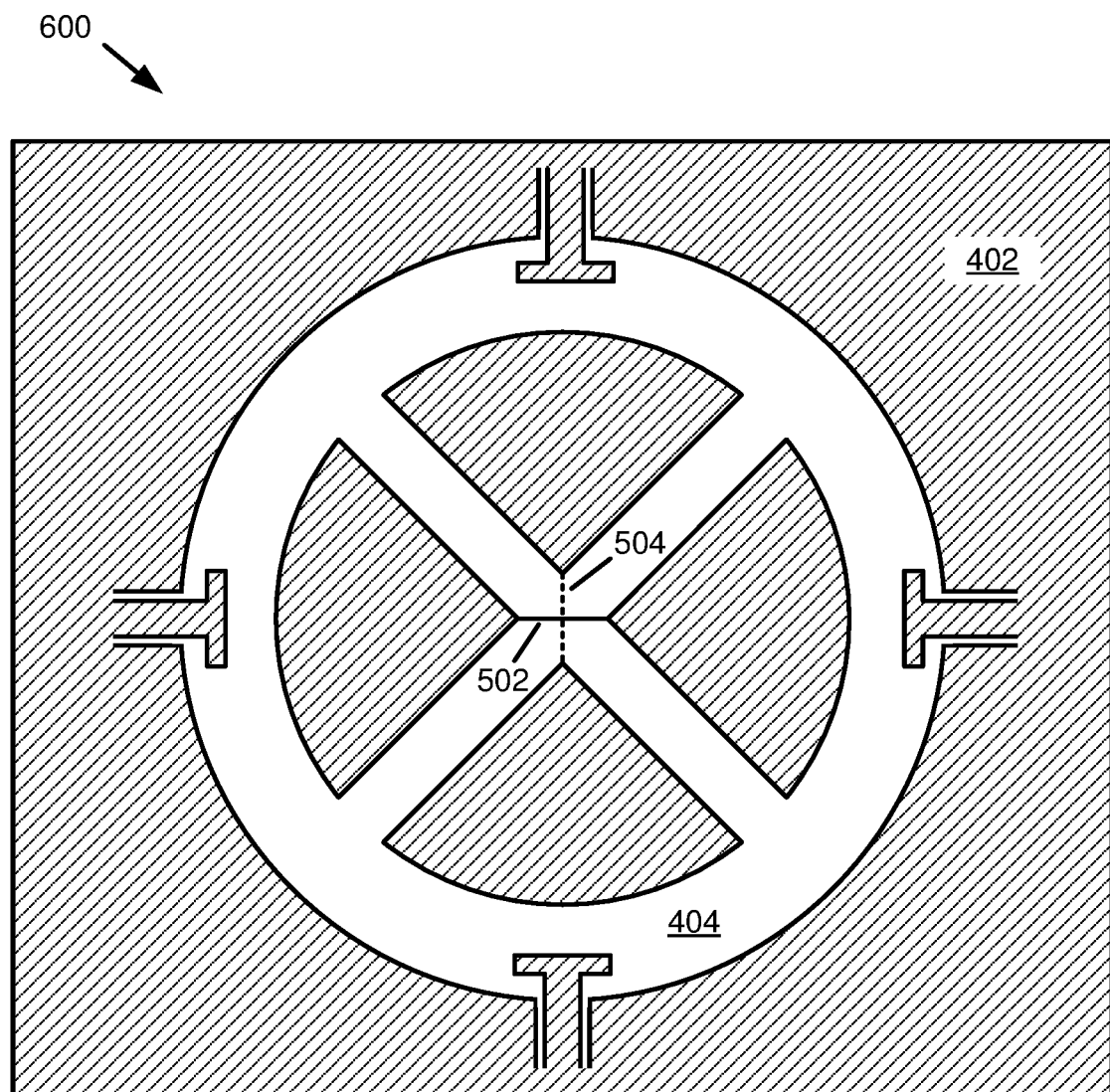

In an aspect, the resonators, coupling pads, and capacitor pads can be defined on the superconducting metal layer 402 as shown by diagram 400 using one or more lithography techniques. Subsequently, the capacitor gaps 404 and/or other components of the qubit device can be removed via etching the superconducting metal layer 402 and/or by other suitable means (e.g., via liftoff) to obtain the device structures shown by diagram 400. Following surface fabrication as shown by diagram 400, fabrication of a qubit device can proceed as shown by diagram 500 in FIG. 5 by defining connectors 502, 504 connecting the respective capacitor pads of the qubit device. In an aspect, the connectors 502, 504 can be defined onto a qubit device via electron beam (e-beam) lithography, in which aluminum and/or another suitable material can be evaporated along the lines indicated for connectors 502, 504 with reference to an e-beam resist applied to the affected portions of the qubit device. For instance, e-beam resist can be placed onto the qubit device at the desired areas for connectors 502, 504 in order to enable the evaporation of junction material at those areas. In an aspect, the connectors 502, 504 can be defined using an e-beam resist of a sufficient thickness to act as a shadow during subsequent parts of the fabrication process. Next, the sample stage can be aligned to be along one particular polarity, e.g., the polarity corresponding to connectors 502. Once the stage is aligned, a glancing angle evaporation and/or deposition technique can be used to deposit the connectors 502. Diagram 600 in FIG. 6 illustrates an example in which connector 502 is fully evaporated onto the qubit device in this manner in a first evaporation stage. As noted above, the evaporation step shown by FIG. 6 could also be performed for part (e.g., half) of connector 502.

Figure 7:
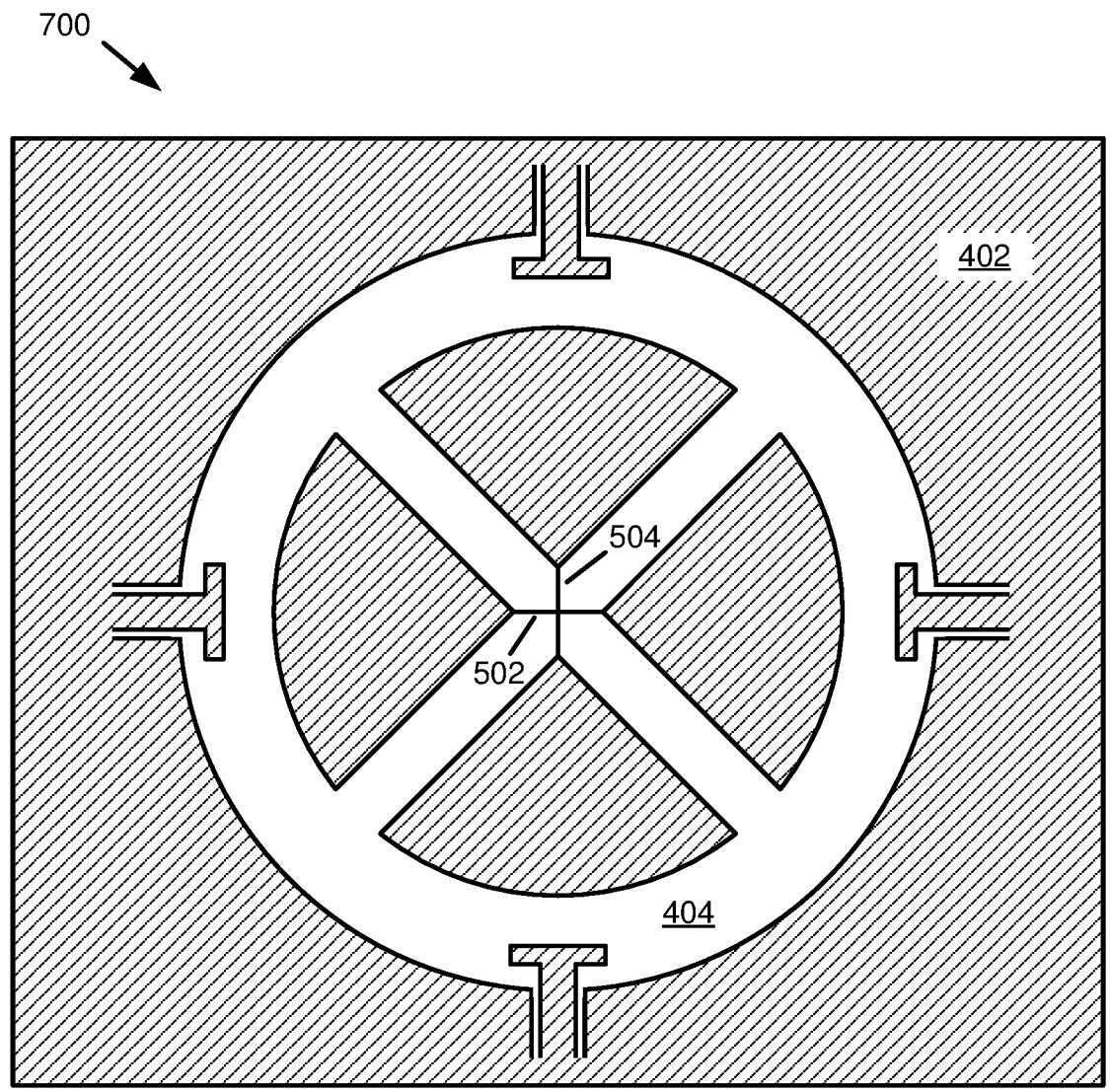

Subsequently, the surface of all or a portion of connector 502 can be oxidized, resulting in an aluminum oxide layer at the surface of connector 502. Following oxidation, connector 504 can be fabricated by rotating the fabrication stage and/or the evaporation source and performing similar evaporations as those described above for connector 502. Diagram 700 in FIG. 7 illustrates the completed states of connectors 502 and 504 following completion of rotation and evaporation. In an aspect, connector 504 is formed at least partially onto the metal oxide layer at the surface of connector 502, resulting in the formation of a Josephson junction between connectors 502 and 504.

In an aspect, once the connectors 502, 504 have been deposited as described above with respect to FIGS. 5-7, connectors 502, 504 can be undercut via etching, liftoff, and/or another suitable process, thereby physically decoupling connectors 502, 504, as well as the junction formed between them, from the surface of the dielectric material layer of the qubit device. Decoupling the connectors 502, 504 from the qubit device surface can reduce the contribution of the central portion of the qubit device to device energy loss and/or other performance degradation. Other benefits are also possible.

Figure 8:
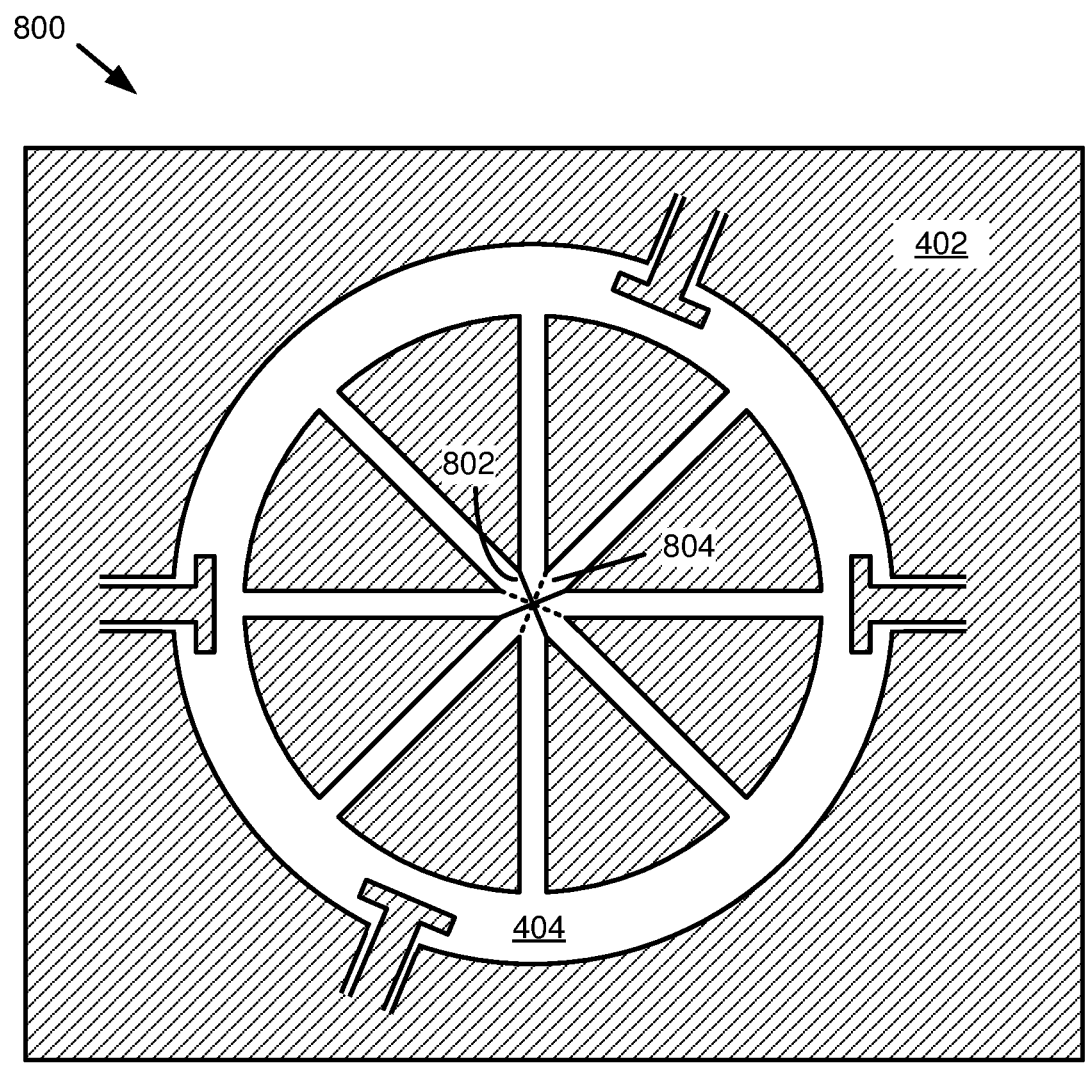

In an aspect, the connector and junction formation as described above with respect to FIGS. 5-7 can be extended to a qubit device with higher order poles. Diagram 800 in FIG. 8 illustrates a specific, non-limiting example of the techniques described above being extended to an octopole qubit. While diagram 800 illustrates an octopole qubit, it should be appreciated that the process illustrated by FIG. 8 could also be used for a qubit device of any suitable number of poles where geometrically opposite pads have the same polarity. In an aspect, the process shown by diagram 800 can begin by defining connectors 802, 804 via an e-beam resist in a similar manner to that described above with respect to FIG. 5. Next, the sample stage can be aligned to be along one particular polarity, e.g., the polarity corresponding to connectors 502. Once the stage is aligned, a glancing angle evaporation and/or deposition technique can be used to deposit individual ones of the connectors 502. Other same-polarity poles can then be connected by rotating the sample stage by 360/2n degrees, where n is the number of poles of the qubit device, after each individual deposition step. Following deposition of the first connectors 502, the deposited metal can be oxidized to form a metal oxide layer as generally described above with respect to FIGS. 5-7. The stage can then be rotated by 360/n degrees to align the poles of the second polarity, and the above deposition steps can be repeated to deposit the second connections 804. Upon conclusion of the deposition of connectors 802 and 804, a liftoff process can be performed to complete the connectors 802, 804.

While the above description relates to the specific, non-limiting example in which connectors 502, 504 and 802, 804 are created via e-beam lithography, it should be appreciated that other techniques for fabricating the connectors 502, 504 or 802, 804 and/or their corresponding junctions could also be used. It should be further appreciated that the techniques described above are not intended to be limited to any particular fabrication technique and/or combination of techniques and that the structures shown and described herein could be produced via any suitable fabrication technology either presently known or developed in the future.

Figure 9:
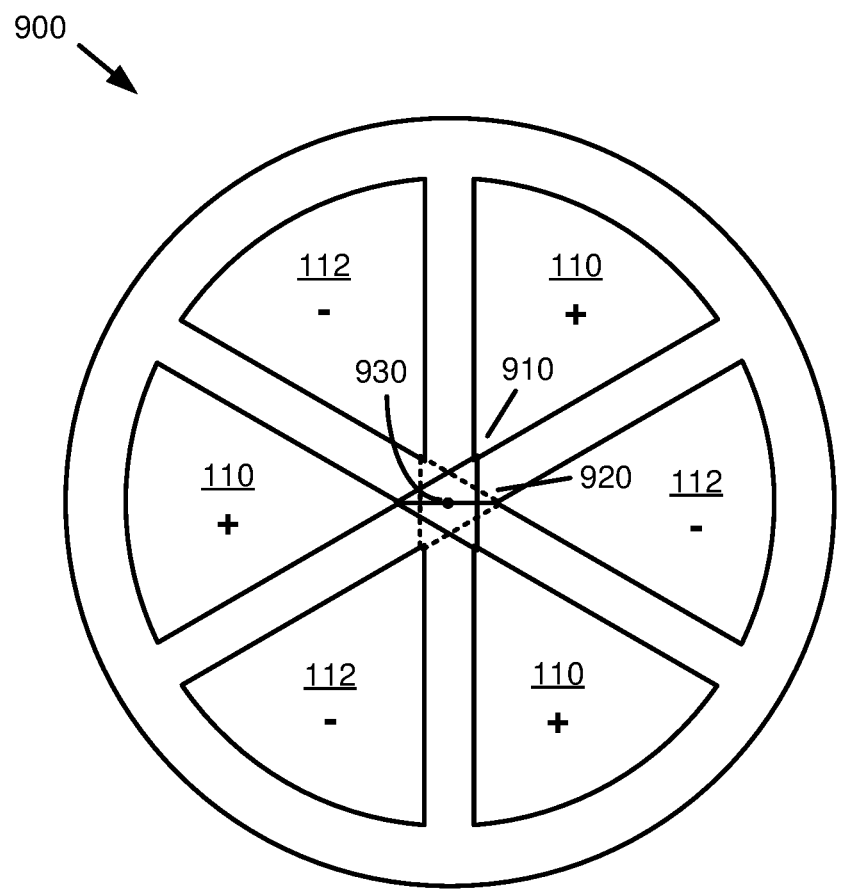
FIG. 9 is a schematic diagram of an alternative symmetrical qubit device with reduced far-field radiation according to one or more embodiments described herein.

Turning now to FIG. 9, a schematic diagram of an alternative qubit device 900 that facilitates reduced far-field radiation according to one or more embodiments described herein is illustrated. Repetitive description of like elements employed in other embodiments described herein is omitted for sake of brevity. As shown in FIG. 9, the qubit device 900 can include superconducting capacitor pads 110, 112 that are positioned about a defined location of the qubit device 900 (e.g., a center of the qubit device 900 or any other suitable location) in a similar manner to qubit device 100 as shown in FIG. 1. Additionally, the pads 110, 112 can have respective polarities that alternate between a first (e.g., positive) polarity and a second (e.g., negative) polarity that is opposite the first polarity, similar to the pads 110, 112 of qubit device 100.

In contrast to the four capacitor pads 110, 112 associated with the qubit device 100, the qubit device 900 shown in FIG. 9 can be configured with a hexapole design that includes six corresponding pads 110, 112. Variance in the number of pads 110, 112 of a qubit device, e.g., between qubit devices 100 and 900, can be introduced to improve radiation emitted from the qubit device, to optimize capacitances associated with the pads 110, 112 and/or the capacitor gaps between them, and/or for any other suitable reason. In general, a qubit device as described herein can have any number of pads 110, 112, provided that at least two pads have a first polarity and at least two distinct pads have a second, distinct polarity.

As further shown by FIG. 9, the qubit device 900 can include respective connecting structures 910, 920 that electrically couple respective ones of the superconducting capacitor pads 110, 112 that have a same polarity. In the example shown by FIG. 9, a first connecting structure 910 can connect respective pads 110 having a positive polarity, and a second connecting structure 920 can connect respective pads 112 having a negative polarity. Other structural configurations could also be used.

In an aspect, the connecting structures 910, 920 can be physical structures of a superconducting material that provide electrical connections between respective pads 110, 112 of the qubit device 900, e.g., to short respective ones of the pads 110, 112 having the same polarity. At least one of the connecting structures 910, 920 can be suspended relative to a dielectric surface of the qubit device 900 such that the connecting structures 910, 920 can occupy different relative positions in three-dimensional space, e.g., such that connecting structure 910 is above connecting structure 920 as shown in FIG. 9 in relative terms with respect to the page. By way of example, the first connecting structure 910 can be formed onto and/or otherwise positioned adjacent to a substrate of the qubit device 900, and the second connecting structure 920 can be suspended at a nonzero distance from the substrate of the qubit device 900, e.g., by releasing the second connecting structure 920 from the qubit device 900 via a liftoff process or other suitable means. As used herein, a connecting structure 910 and/or 920 that is suspended from the dielectric surface of the qubit device 900 can also be referred to as an "airbridge" or an "airbridge structure."

While the connecting structures 910, 920 shown by FIG. 9 connect respective associated pads 110, 112 via respective triangular shapes, other physical configurations could also be used. For instance, additional capacitor pads and/or associated poles could be connected by extending the sides of the geometry associated with the connecting structures 910, 920 shown in FIG. 9, e.g., to squares, pentagons, etc. In general, the connecting structures 910, 920 can be of any physical configuration suitable for providing a first set of electrical connections among the first set of pads 110 and a second, distinct, set of electrical connections among the second set of pads 112.

Figure 10:
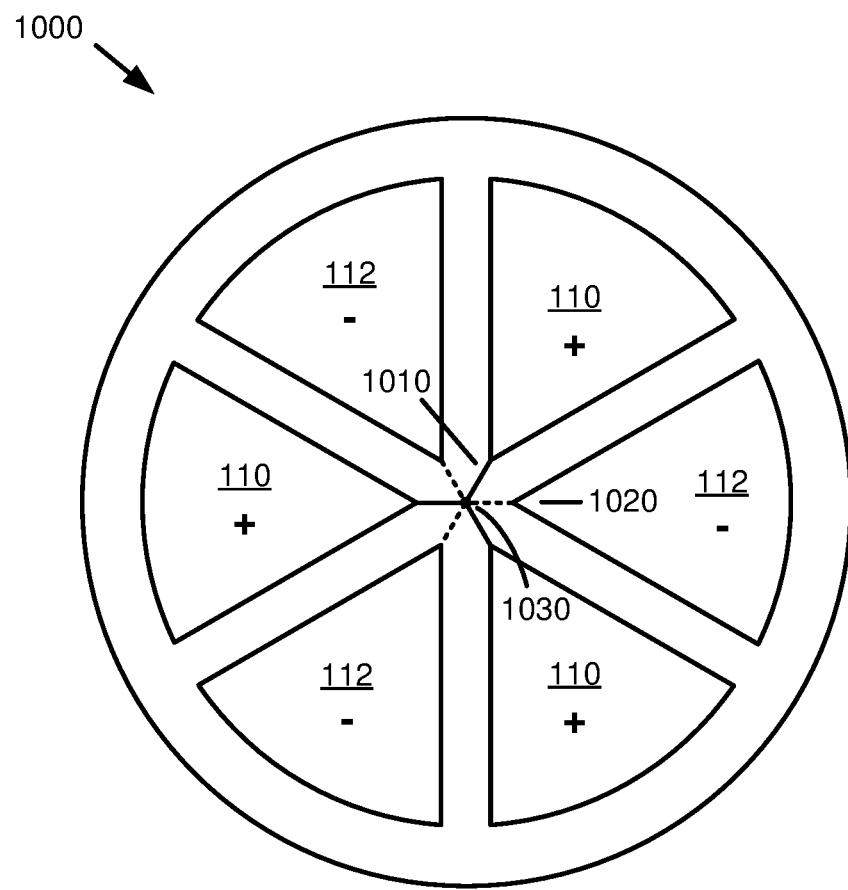
FIG. 10 is a schematic diagram of a qubit device having respective sets of connectors according to various embodiments described herein.

In an aspect, a Josephson junction 930 can be formed at qubit device 900 to connect at least two antipads (e.g., capacitor pads 110, 112 of opposite polarity) of the qubit device 900 in any suitable manner. For instance, a Josephson junction of qubit device 900 can be fabricated as a dolan, a Manhattan-style junction, and/or any other suitable junction type. Alternatively, respective sets of connectors 1010, 1020 can be formed to define a corresponding Josephson junction 1030, as shown by qubit device 1000 in FIG. 10. The qubit device 1000 shown by FIG. 10 can include respective sets of connectors 1010, 1020 that electrically couple respective (e.g., at least two) capacitor pads 110 of qubit device 1000 that have the same polarity. In the example shown by FIG. 10, the connectors 1010, 1020 of qubit device 1000 can include respective connectors that extend from respective ones of the capacitor pads 110, 112 to a defined location, here the center of the qubit device 1000. In an aspect, an oxidation interruption step can be performed between fabrication of the connectors 1010, 1020 to define a Josephson junction 1030 between the connectors 1010, 1020 in a similar manner to that described above with respect to FIGS. 2 and 5.

Figure 11:
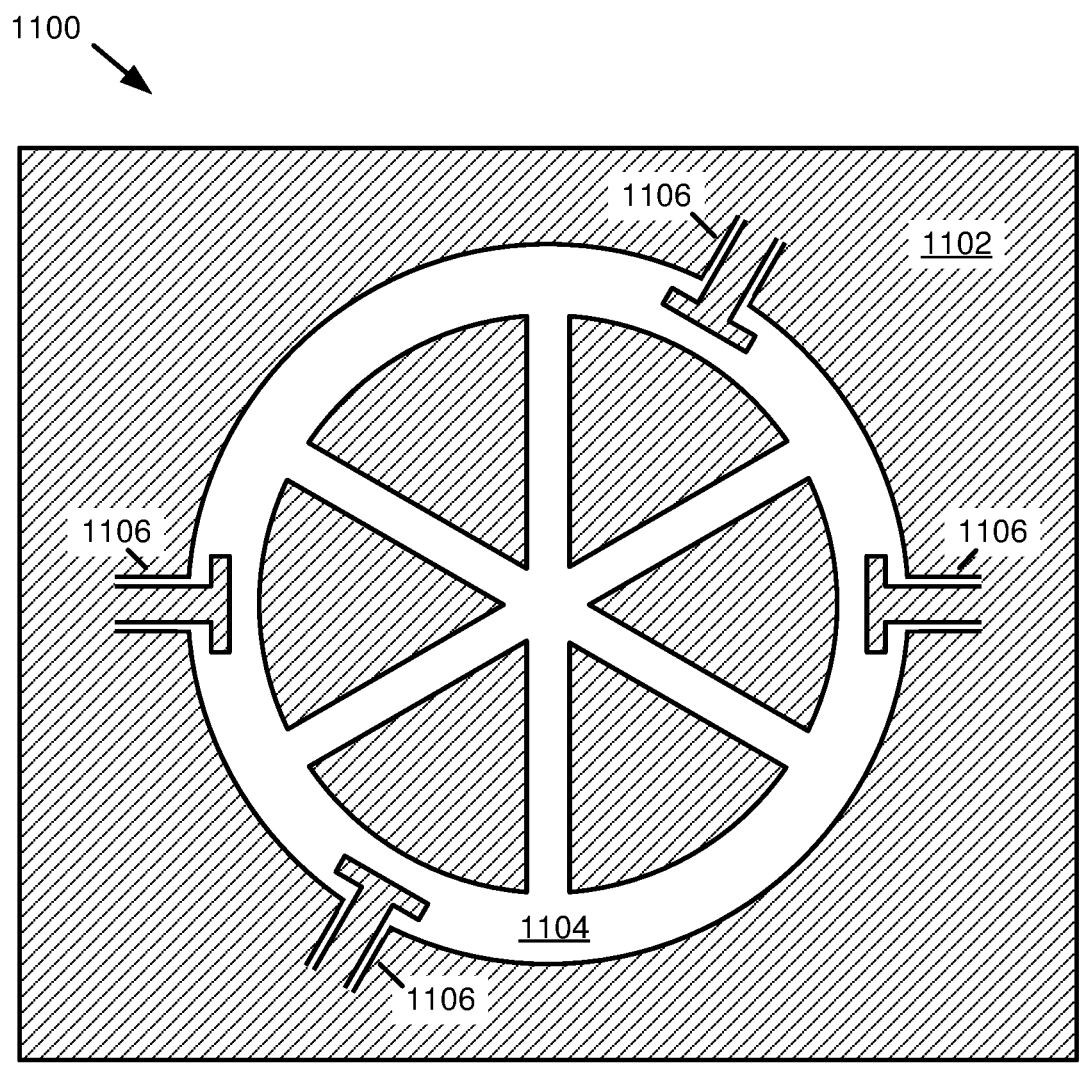
FIGS. 11-13 are diagrams illustrating respective alternative process steps for fabricating a symmetrical qubit with reduced far-field radiation according to various embodiments described herein.
Figure 12:
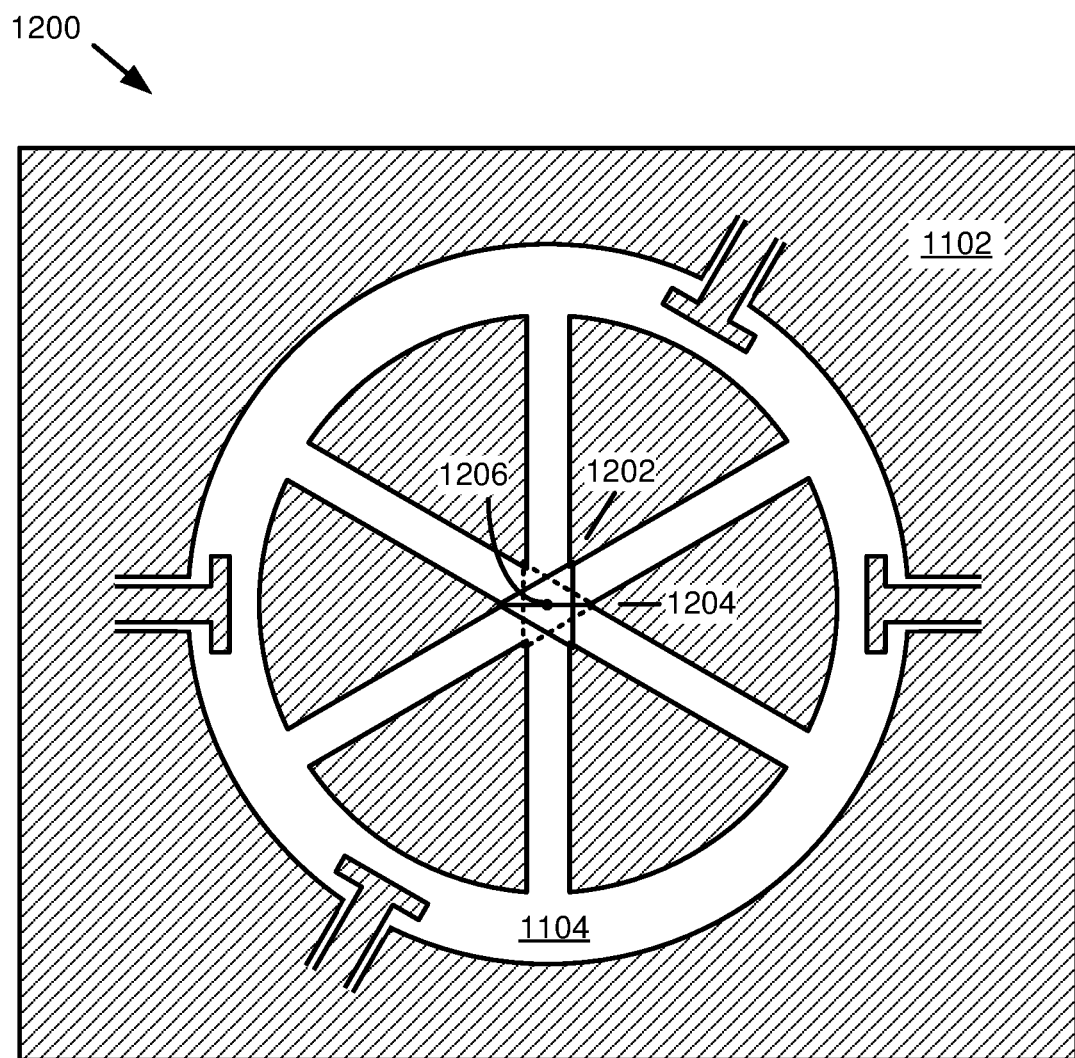
Figure 13:
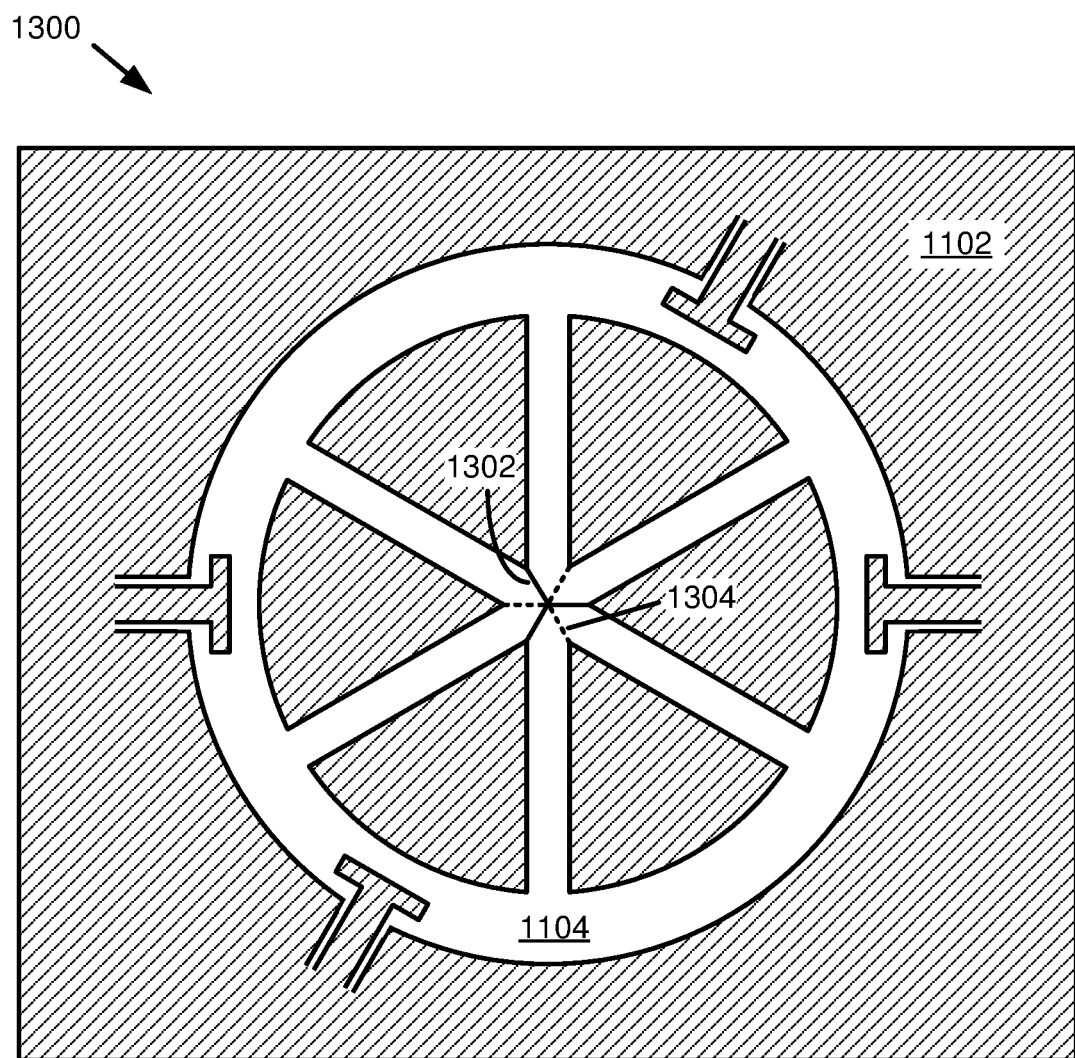

With reference now to FIGS. 11-13, respective fabrication steps that can be utilized to produce a symmetrical qubit with reduced far-field radiation according to various embodiments described herein are illustrated. Repetitive description of like elements employed in other embodiments described herein is omitted for sake of brevity. It should be appreciated that FIGS. 11-13 and their accompanying description are provided merely as a non-limiting example of qubit fabrication process steps that could be used and that other suitable processes and/or process steps are also possible.

In an aspect, an example qubit fabrication process can begin as shown by diagram 1100 in FIG. 11, in which the structure of the qubit device can be defined within a device area. The device area can include, e.g., a dielectric material covered by a superconducting metal layer 1102. As shown by diagram 1100, the qubit device structure can include one or more capacitor pads positioned about a defined location of the superconducting metal layer 1102 as defined by respective capacitor gaps 1104. In an aspect, a size of the capacitor gaps 1104 can be selected to reduce far-field radiation emitted by the qubit device, to reduce the coupling from the qubit device to the external environment, to optimize surface losses, and/or based on other criteria.

Additionally, the qubit device structure shown in diagram 1100 can include respective coupling pads 1106 positioned adjacent to respective ones of the capacitor pads of the qubit device. In a similar manner to that described above with respect to FIG. 3, the respective coupling pads 1106 can be associated with a bus resonator, a readout resonator, and/or other suitable device components. With respect to diagram 1100, it can also be appreciated that coupling pads 1106 of a qubit device, such as the hexapole qubit device illustrated by diagram 1100, can in some cases be associated with fewer than all poles of the qubit device.

In an aspect, the components of the qubit device as illustrated by diagram 1100 can be defined on the superconducting metal layer 1102 using one or more suitable techniques, such as those described above with respect to FIG. 4. These techniques can include, but are not limited to, lithography, etching, liftoff, and/or any other suitable techniques.

Following surface fabrication as shown by diagram 1100, qubit device fabrication can proceed as shown by diagram 1200 in FIG. 12 by defining connecting structures 1202, 1204 that electrically couple respective same-polarity capacitor pads of the qubit device, e.g., as described above with respect to FIG. 9. In one aspect, a first connecting structure 1202 can be formed by depositing a superconductive material onto the dielectric material defined by the capacitor gaps 1104. The second connecting structure 1204 can then be formed onto the device structure using similar material. The material of the second connecting structure 1204 can then be undercut, releasing the second connecting structure 1204 and causing it to act as a suspended airbridge that couples respective capacitor pads without physically contacting the surface of the capacitor gaps 1104. Before or after fabrication and/or release of the connecting structures 1202, 1204, a Josephson junction 1206 can be formed between respective pads of the qubit device having opposite polarities according to one or more junction fabrication techniques as known in the art in a separate fabrication step than that used to form the connecting structures 1202, 1204.

In addition to, or in place of, fabrication of airbridges and/or corresponding connecting structures 1202, 1204 and a Josephson junction 1206 as shown by diagram 1200, respective sets of connectors 1302, 1304 can be created as shown by diagram 1300 in FIG. 13. In the example shown by diagram 1300, the connectors 1302, 1304 are Y-shaped connectors that couple respective capacitor pads of a hexapole qubit device that have the same polarity. In an aspect, the connectors 1302, 1304 can be fabricated using similar techniques to those described above with respect to FIGS. 5-8. By way of example, a first set of connectors 1302 can be formed using lithography and metal deposition followed by liftoff. Next, a surface of the first set of connectors 1302 can be oxidized (e.g., in air), thereby creating a metal oxide layer on the surface of the first set of connectors 1302. Subsequently, the second set of connectors 1304 can be formed via separate lithography, metal deposition, and liftoff stages, thereby creating a Josephson junction via the metal oxide layer between the connectors 1302, 1304.

Figure 14:
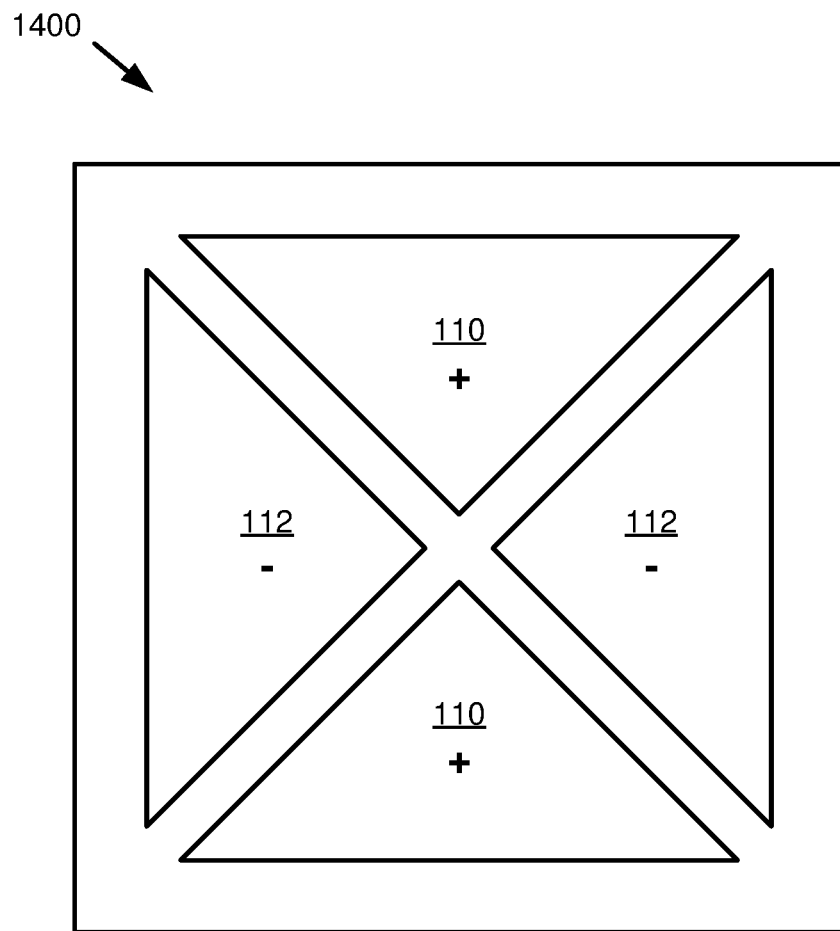
FIG. 14 is a schematic diagram of an alternative quadrapole qubit that can be employed according to various embodiments described herein.
Figure 15:
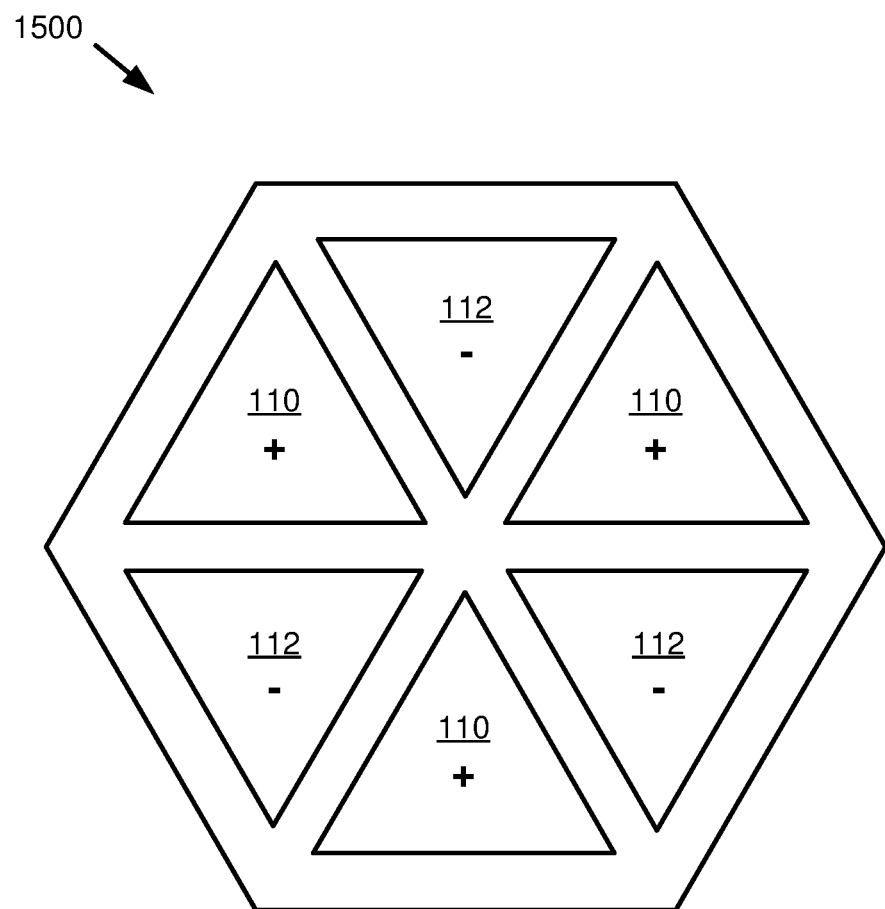
FIG. 15 is a schematic diagram of an alternative hexapole qubit that can be employed according to various embodiments described herein.

While respective ones of the example qubit structures described above have been associated with circular geometries, it should be appreciated that other shapes and/or geometries could also be used. By way of specific, non-limiting example, a qubit device can have a square structure as shown by diagram 1400 in FIG. 14, a hexagonal structure as shown by diagram 1500 in FIG. 15, and/or any other suitable structure(s). Other geometric configurations are also possible.

Figure 16:
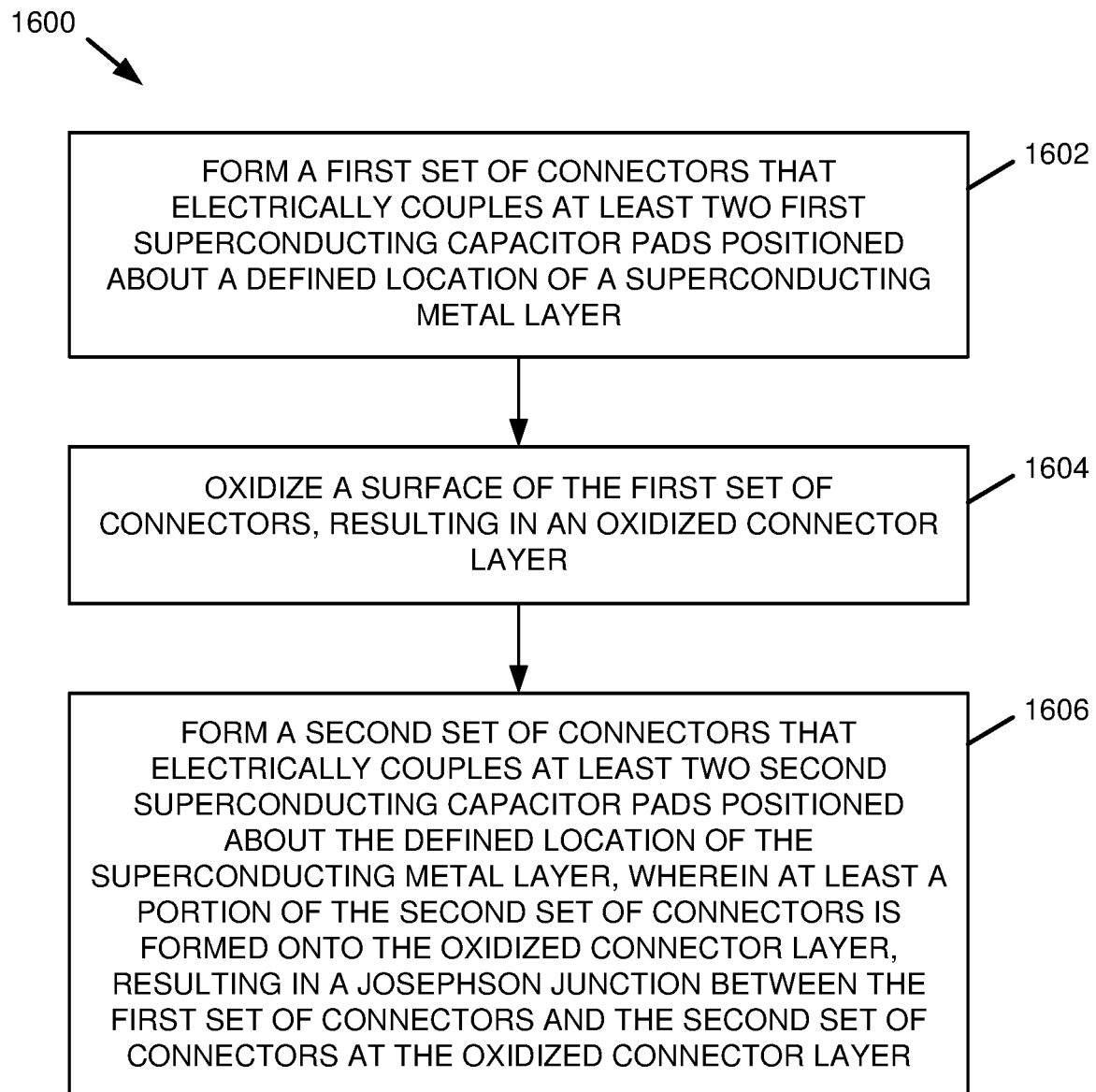
FIGS. 16-17 are flow diagrams of respective methods that facilitate fabrication of a symmetrical qubit with reduced far-field radiation according to one or more embodiments described herein.

FIG. 16 illustrates a flow diagram of an example, non-limiting method 1600 that facilitates fabrication of a symmetrical qubit with reduced far-field radiation according to one or more embodiments described herein. Repetitive description of like elements employed in other embodiments described herein is omitted for sake of brevity.

At 1602, a first set of connectors (e.g., connectors 502) can be formed that electrically couple at least two first superconducting capacitor pads (e.g., pads 110) positioned about a defined location of a superconducting metal layer (e.g., superconducting metal layer 402).

At 1604, a surface of the first set of connectors formed at 1602 can be oxidized, resulting in an oxidized connector layer.

At 1606, a second set of connectors (e.g., connectors 504) can be formed that electrically couple at least two second superconducting capacitor pads (e.g., pads 112) positioned about the defined location of the superconducting metal layer. At least a portion of the second set of connectors formed at 1606 can be formed onto the oxidized connector layer created at 1604, resulting in a Josephson junction between the first set of connectors and the second set of connectors at the oxidized connector layer.

Figure 17:
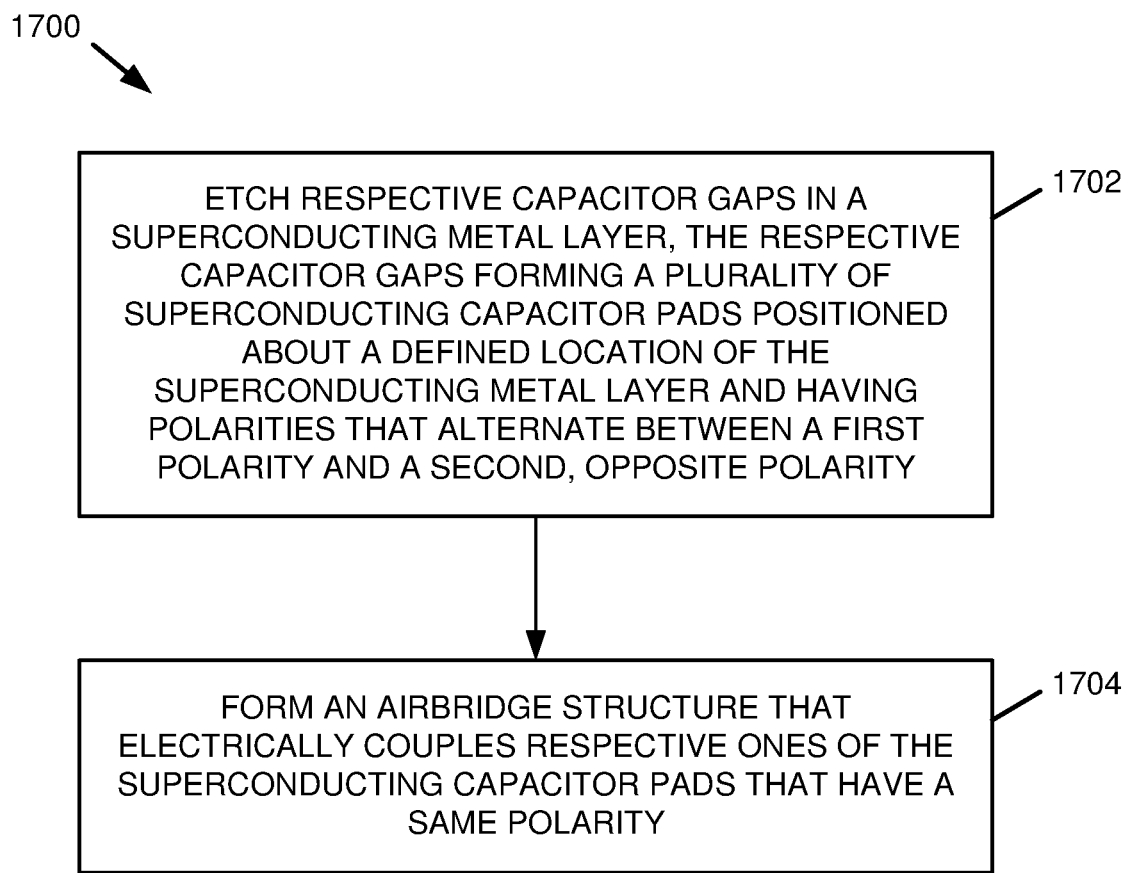

FIG. 17 illustrates a flow diagram of an alternative example, non-limiting method 1700 that facilitates that facilitates fabrication of a symmetrical qubit with reduced far-field radiation according to one or more embodiments described herein. Repetitive description of like elements employed in other embodiments described herein is omitted for sake of brevity.

At 1702, respective capacitor gaps (e.g., capacitor gaps 1104) can be etched in a superconducting metal layer (e.g., superconducting metal layer 1102). The respective capacitor gaps can form a plurality of superconducting capacitor pads (e.g., pads 110, 112) positioned about a defined location of the superconducting metal layer and having respective polarities that alternate between a first (e.g., positive) polarity, and a second (e.g., negative), opposite polarity in a similar manner to that described above with respect to method 1600.

At 1704, an airbridge structure (e.g., a connecting structure 1202 and/or 1204 that is suspended from a dielectric layer) can be formed that electrically couples respective ones of the superconducting capacitor pads defined at 1702 that have a same polarity.

For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies in accordance with the disclosed subject matter. In addition, those skilled in the art will understand and appreciate that the methodologies can alternatively be represented as a series of interrelated states via a state diagram or events.

The flowchart and block diagrams in the Figures illustrate the architecture, functionality, and operation of possible implementations of systems and methods according to various embodiments provided herein. In some implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

What has been described above include mere examples of systems and methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Various modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A qubit device comprising:
    a first set of connectors that electrically couples first superconducting capacitor pads positioned about a defined location of the qubit device;
    a second set of connectors that electrically couples second superconducting capacitor pads positioned about the defined location of the qubit device, wherein the first superconducting capacitor pads have a first polarity, the second superconducting capacitor pads have a second polarity that is opposite the first polarity, and the first superconducting capacitor pads and the second superconducting capacitor pads are positioned in an alternating arrangement about the defined location of the qubit device; and
    a Josephson junction formed between the first set of connectors and the second set of connectors.

2. The qubit device of claim 1, wherein the first set of connectors and the second set of connectors are rotationally symmetric about the defined location.

3. The qubit device of claim 1, further comprising an oxide barrier between a portion of the first set of connectors and a portion of the second set of connectors.

4. The qubit device of claim 1, further comprising:
respective coupling pads positioned adjacent to respective ones of the first superconducting capacitor pads or the second superconducting capacitor pads.

5. The qubit device of claim 4, wherein the respective coupling pads are associated with at least one of a bus resonator or a readout resonator.

6. The qubit device of claim 1, wherein the first set of connectors and the second set of connectors comprise aluminum.

7. The qubit device of claim 1, wherein the Josephson junction comprises aluminum oxide.

8. The qubit device of claim 1, further comprising capacitor gaps formed between respective adjacent ones of the first superconducting capacitor pads and the second superconducting capacitor pads.

9. A method comprising:
forming first superconducting capacitor pads positioned about a defined location of a superconducting metal layer;
forming second superconducting capacitor pads positioned about the defined location of the superconducting metal layer, wherein the first superconducting capacitor pads have a first polarity, the second superconducting capacitor pads have a second polarity that is opposite the first polarity, and the first superconducting capacitor pads and the second superconducting capacitor pads are positioned in an alternating arrangement about the defined location; and
forming a Josephson junction on the first superconducting capacitor pads and the second superconducting capacitor pads.

10. The method of claim 9, wherein the forming the Josephson junction comprises:
forming a first set of connectors that electrically couples the first superconducting capacitor pads; and
forming a second set of connectors that electrically couples the second superconducting capacitor pads positioned about the defined location of the qubit device.

11. The method of claim 10, wherein the forming the Josephson junction further comprises forming the first set of connectors and the second set of connectors rotationally symmetric about the defined location.

12. The method of claim 10, wherein the forming the Josephson junction further comprises forming an oxide barrier between a portion of the first set of connectors and a portion of the second set of connectors.

13. The method of claim 9, further comprising forming respective coupling pads positioned adjacent to respective ones of the first superconducting capacitor pads or the second superconducting capacitor pads.

14. The method of claim 13, wherein the respective coupling pads are associated with at least one of a bus resonator or a readout resonator.

15. The method of claim 9, further comprising, further comprising forming capacitor gaps between respective adjacent ones of the first superconducting capacitor pads and the second superconducting capacitor pads.

16. A superconducting quantum logic circuit comprising:
an array of qubits linked by a quantum bus;
wherein a qubit of the array of qubits comprises:
a first set of connectors that electrically couples first superconducting capacitor pads positioned about a defined location of the qubit;
a second set of connectors that electrically couples second superconducting capacitor pads positioned about the defined location of the qubit, wherein the first superconducting capacitor pads have a first polarity, the second superconducting capacitor pads have a second polarity that is opposite the first polarity, and the first superconducting capacitor pads and the second superconducting capacitor pads are positioned in an alternating arrangement about the defined location; and
a Josephson junction formed between the first set of connectors and the second set of connectors.

17. The superconducting quantum logic circuit of claim 16, further comprising an oxide barrier between a portion of the first set of connectors and a portion of the second set of connectors.

18. The superconducting quantum logic circuit of claim 16, further comprising:
respective coupling pads positioned adjacent to respective ones of the first superconducting capacitor pads or the second superconducting capacitor pads.

19. The superconducting quantum logic circuit of claim 18, wherein the respective coupling pads are associated with at least one of a bus resonator or a readout resonator.

20. The superconducting quantum logic circuit of claim 16, wherein the first set of connectors and the second set of connectors comprise aluminum.

* * * * *